(12) United States Patent
Yaung et al.

(10) Patent No.: US 6,995,411 B2
(45) Date of Patent: Feb. 7, 2006

(54) IMAGE SENSOR WITH VERTICALLY INTEGRATED THIN-FILM PHOTODIODE

(75) Inventors: Dun-Nian Yaung, Taipei (TW); Sou-Kuo Wu, Hsinchu (TW); Ho-Ching Chien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/780,790

(22) Filed: Feb. 18, 2004

(65) Prior Publication Data

US 2005/0179063 A1 Aug. 18, 2005

(51) Int. Cl.
*H01L 29/76* (2006.01)

(52) U.S. Cl. .......................... 257/213; 257/53; 257/292; 257/458; 257/755; 257/756; 257/73; 257/74; 257/96

(58) Field of Classification Search .................. 257/53, 257/292, 458, 755, 756; 438/73, 74, 96

See application file for complete search history.

(56) References Cited

U.S. PATENT DOCUMENTS 6,852,566 B2 * 2/2005 Yaung ........................ 438/74

* cited by examiner

*Primary Examiner*—Mai-Huong Tran
(74) *Attorney, Agent, or Firm*—Thomas, Kayden, Horstemeyer & Risle

(57) ABSTRACT

An image sensor has a vertically integrated thin-film photodiode. In one implementation, the image sensor has a substrate, an interconnection structure adjacent to the substrate, wherein the interconnection structure includes a top metal layer comprising a plurality of first metal pads for thin-film photodiodes and a second metal pad for a ground pad, a dielectric layer with a plurality of first openings and second opening disposed on the interconnection structure, a plurality of bottom doped layers with a first conductive type respectively disposed in the first openings, wherein each bottom doped layer contacts the corresponding first metal pad without extending outside the surface of the corresponding first metal pad, an I-type layer disposed over at least one bottom doped layer and the dielectric layer, an upper doped layer with a second conductive type disposed over the I-type layer, and a transparent electrode disposed over the upper doped layer and contacting the second metal pad through the second opening in the dielectric layer.

12 Claims, 8 Drawing Sheets

IMAGE SENSOR WITH VERTICALLY INTEGRATED THIN-FILM PHOTODIODE

BACKGROUND OF THE INVENTION

1. Field of the Invention

This invention relates generally to an image sensor. In particular, it relates to an image sensor with a vertically integrated PIN thin-film photodiode.

2. Description of the Related Art

Solid state image sensors, which are used in applications such as digital cameras, are currently available in numerous forms. Charge coupled devices (CCD) and CMOS image sensors, for example, are based on a two dimensional array of pixels. Each pixel contains a light sensing device that is capable of converting an optical image into an electronic signal. When photons strike the photoactive region of the array, free charge carriers are generated in an amount that is linearly proportional to the incident photon radiation. The photon generated charge carriers are collected and moved to output circuitry for processing. The pixels are typically disposed in rows and columns to form the array.

Integration of the image sensors with signal processing circuitry has become more important because integration enables miniaturization and simplification of imaging systems. Integration of image sensors along with analog and digital signal processing circuitry allows electronic imaging systems to be low cost, compact and require low power consumption.

Typical prior art CMOS image sensors in use rely on a lateral integration of the photodetector and the pixel electronics. In a laterally integrated CMOS image sensor, the photodetector and the CMOS circuitry are fabricated next to each other on the silicon substrate. Thus, additional lateral area ("real estate") is required for the lateral integration of the photodetector with the CMOS circuitry. This can reduce the area fill factor and limit the possible resolution. Furthermore, it is difficult to optimize the process technology for both the CMOS transistor and for the photodiode at the same time. For example, while the design of fast CMOS circuits demands the use of shallow junctions with very low sheet resistance, these junctions are totally inconsistent for use as a photodiode. Also, when additional on-chip functions are added to the sensors, either the pixel size will increase to maintain the sensitivity of the sensor or the area required for the photodiode will decrease to maintain the pixel size. If the pixel size increases to maintain the sensitivity, the resolution of the sensor will decrease. If the photodiode area decreases to maintain the pixel size, the sensitivity of the sensor may decrease.

In a laterally integrated CMOS image sensor, as the pixel size is shrunk and multi-layer metal is used to increase circuit density and realize camera-on-chip, the photosensitivity of the image sensor is degraded due to light scattering, low fill factor (which is the ratio of photodetector area to pixel area) and destructive difference (different refraction index, n, dielectric film used in ILD/IMD).

Recently, vertically integrated thin film photodiode has been used to increase photosensitivity.

In U.S. Pat. No. 6,288,435 to Ping Mei et al, the occurrence of vertical leakage current if the metal line (contacting the data line) is exposed to the intrinsic amorphous silicon is discussed, and a continuous amorphous silicon layer sensors using a wider N+ amorphous silicon layer sealing the metal line or using a doped polysilicon back contact to reduce vertical leakage current is taught. However, the former method needs another mask to generate a wider N+ amorphous silicon layer, and the latter method increases the electric resistance between the PIN element and the data line. Moreover, a multi-layer metal interconnection structure is also needed as the pixel size is shrunk, so as to realize camera-on-chip.

U.S. Pat. No. 6,018,187 to Jeremy A. Theil et al discloses that a conductive lead connected between a bias circuit and the transparent conductive layer contacting the PIN photo diodes is not a reliable connection structure. An elevated PIN diode active pixel sensor including a reliable interconnection structure between the pixel sensor and the substrate is therefore taught. The transparent conductive layer is electrically connected to the substrate through a conductive plug and a bonding pad is designed. Further, an inner metal section is optionally formed between each pixel electrode and the underlying conductive plug to lower resistance to obtain better current collection. However, if the inner metal section is formed to lower resistance between the PIN element and the underlying interconnection, another processing step is needed.

Accordingly, the present invention pertains to the vertical integration of photodetectors with CMOS circuitry with reliable structure, fewer masks and decreased process cost.

SUMMARY OF THE INVENTION

The present invention is an image sensor with a vertically integrated thin-film photodiode in which the bonding opening for connecting the transparent conductive line and the ground pad is formed with the photodiode openings.

The present invention also provides an image sensor with a PIN thin-film photodiode formed with a self-aligned and damascene process.

The present invention also provides an image sensor with lower resistance between the thin-film photodiode and underlying pixel electrode to obtain better current collection without additional steps.

The present invention also provides an image sensor with lower vertical leakage current without additional steps.

In the present invention, the image sensor comprises a bottom doped layer of a thin-film photodiode imbedded in a dielectric layer, wherein a bottom surface of the bottom doped layer completely contacts its corresponding underlying pixel electrode. The bottom doped layers of the thin-film photodiodes are formed by a self-aligned and damascene method, therefore the pixel electrodes are not exposed to the I-type amorphous silicon layer of the thin-film photodiodes. Moreover, the transparent electrode connects the thin-film photodiodes to an external ground voltage power through a ground pad which is a portion of a top metal layer.

Therefore, an image sensor with a vertically integrated thin-film photodiode is provided. An interconnection structure adjacent to a substrate comprises a top metal layer which includes first metal pads for thin-film photodiodes and a second metal pad for a ground pad. A dielectric layer with first openings and a second opening is disposed on the interconnection structure. A plurality of bottom doped layers with a first conductive type are respectively disposed in the first openings, wherein each bottom doped layer contacts the corresponding first metal pad without extending outside the surface of the corresponding first metal pad. An I-type layer is disposed over at least one bottom doped layer and the dielectric layer. An upper doped layer with a second conductive type is disposed over the I-type layer. A transparent electrode is disposed over the upper doped layer and contacting the second metal pad through the second opening in the dielectric layer.

The present invention also provides another image sensor structure. A substrate used to set the image sensor comprises a ground pad region, a pixel array region and a ASIC circuit region. An interconnection structure adjacent to the substrate includes a top metal layer comprising pixel electrodes in the pixel array region, a ground pad in the ground pad region and a circuit pad in the ASIC circuit region. A dielectric layer with a plurality of first openings and a second opening is disposed on the interconnection structure, wherein a bottom of each first opening is a surface of the corresponding pixel electrode. A plurality of bottom doped layers with a first conductive type respectively are disposed in the first openings, and each bottom doped layer contacts the corresponding pixel electrode. An I-type layer is disposed over at least one bottom doped layer and the dielectric layer. An upper doped layer with a second conductive type is disposed over the I-type layer. A light transmitting electrode is disposed over the upper doped layer and contacts the second metal pad through the second opening in the dielectric layer.

According to the above-mentioned image sensor, the thin-film photodiodes are PIN photodiodes. The first conductive type and the second conductive type are N-type and P-type respectively, and vice versa.

The method of forming the bottom doped layers contacting the underlying top metal layer uses self-aligned and damascene processes. After the dielectric layer covers the top metal layer and the first and second openings are formed in the dielectric layer, a layer doped with the first conductive type is conformally formed on the dielectric layer and in the first and second openings. An organic spin-on material is then coated on the layer doped with the first conductive type with a substantially flat plane. The organic spin-on material and the layer doped with the first conductive type is removed until the upper surface of the dielectric layer is exposed, wherein the dielectric layer, and upper surfaces of the organic spin-on material and the layer doped with the first conductive type in the first and second openings together form a substantially planar surface. After defining and forming the bottom doped layer pixel-by-pixel, the remained organic spin-on material is removed.

DETAILED DESCRIPTION OF THE INVENTION

FIGS. 1A–1H are cross sections showing a method of forming an image sensor with a vertically integrated PIN thin-film photodiode. In the figures, region I indicates ground pad region, region II indicates pixel array region, and region III indicates ASIC circuit region.

Figure 1A:
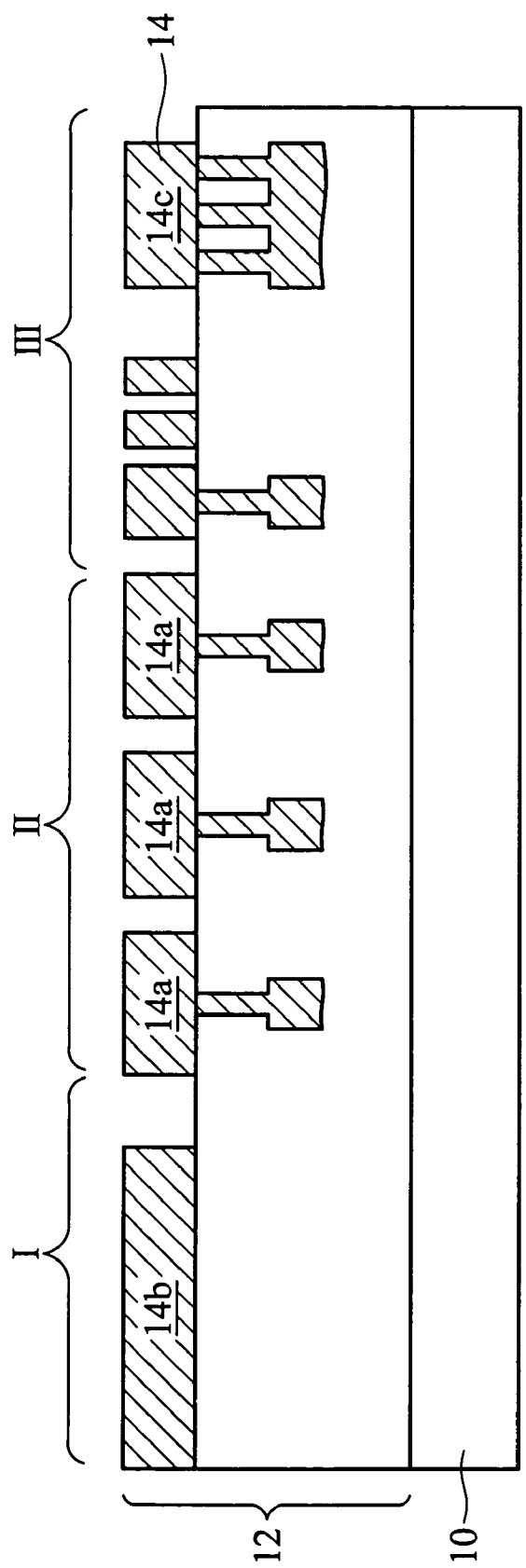
FIGS. 1A–1H are cross sections showing a method of forming an image sensor with a vertically integrated PIN thin-film photodiode.

FIG. 1A shows a substrate 10 with an interconnection structure 12 including a top metal layer 14 formed thereon. The structure and methods of forming this interconnection structure 12 are well known in the field of electronic integrated circuit fabrication. The top metal layer 14 can be made of AlCu. The top metal layer 14 has pixel electrodes 14a (also referred to as bottom electrodes), ground pad 14b and ASIC pads 14c.

Figure 1B:
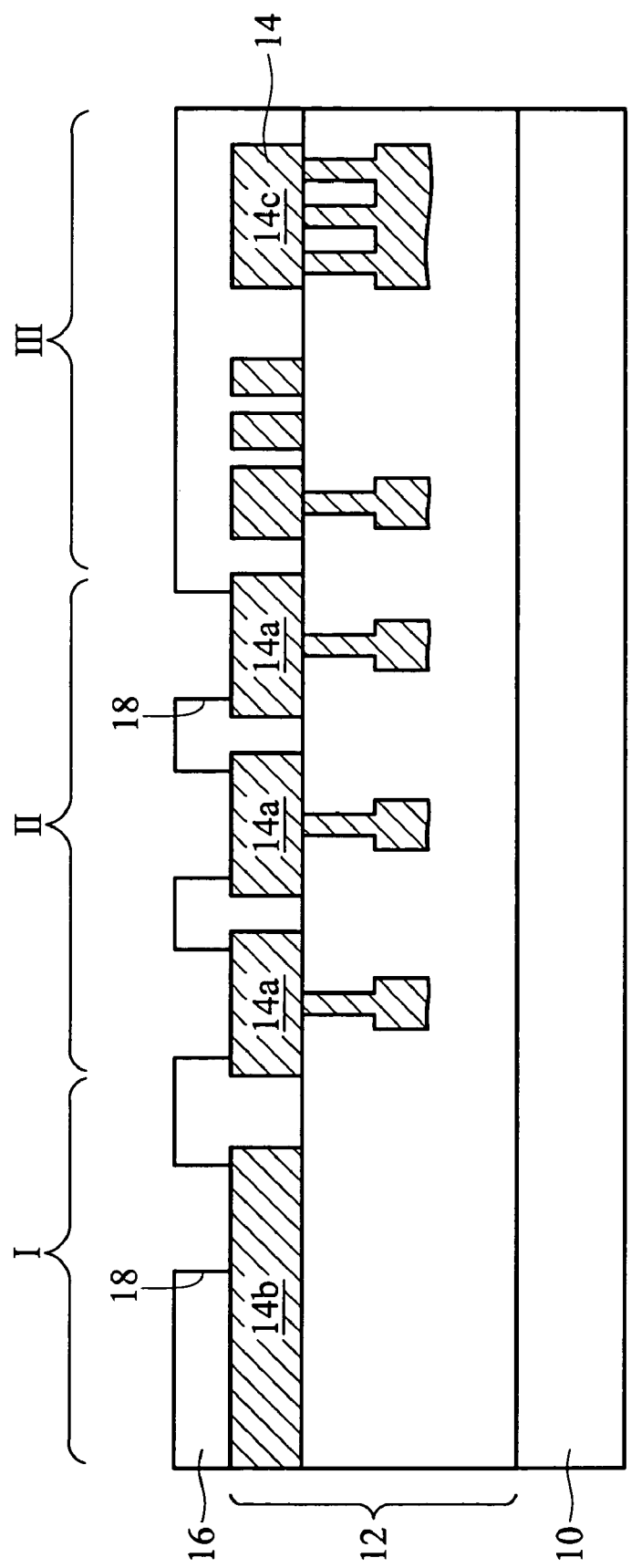

As shown in FIG. 1B, a dielectric layer 16 is then formed on the standard interconnection structure 12 and the top metal layer 14. A plurality of openings 18 are formed through the dielectric layer 16 to expose some surface of the top metal layer 14. The thickness of the dielectric layer 16 between the top surface thereof and the top surface of the top metal layer 14 is about 1,000–10,000 Å. Each opening 18 in the pixel array region II defines each contacting area between each PIN element and corresponding pixel electrode 14a. The size of each opening 18 in the pixel array region II is preferred 0.5 μm×0.5 μm~20 μm×20 μm. The opening 18 in the ground pad region I defines the contacting area between the to-be-formed transparent conductive layer and the ground pad 14b.

Figure 1C:
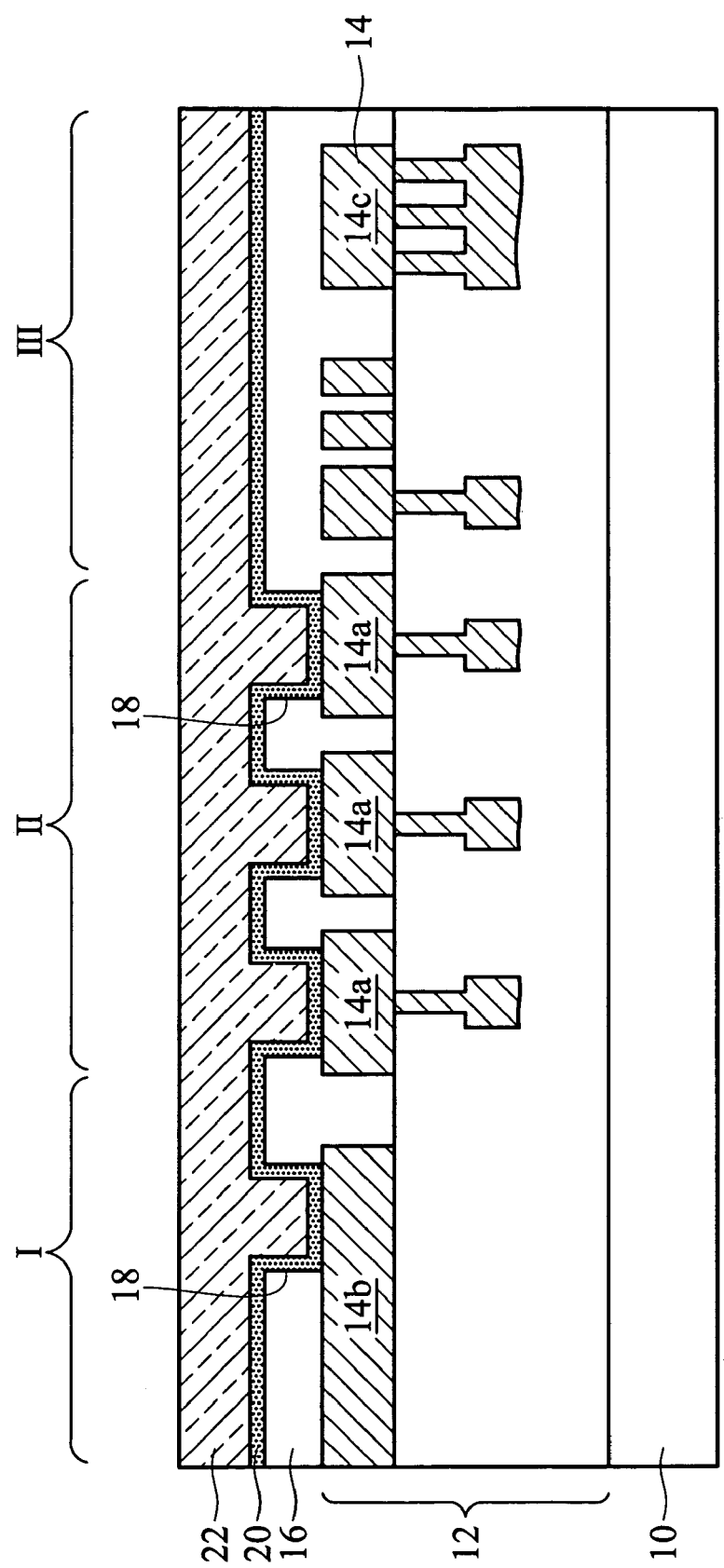

As shown in FIG. 1C, a N-type doped amorphous silicon layer 20 is conformally formed on the dielectric layer 16 and in the openings 18 by, for example, PECVD, and contacts the top metal layer 14 in the bottom of the openings 18. The thickness of the N-type doped amorphous silicon layer 20 is about 100–1,000 Å. An organic spin-on material 22 is coated on the N-type doped amorphous silicon layer 20 with a substantially planar upper surface. The thickness of the organic spin-on material 22 is about 500–8,000 Å. The organic spin-on material 22 can be polymer, photoresist or resin, for example, polyimide.

Figure 1D:
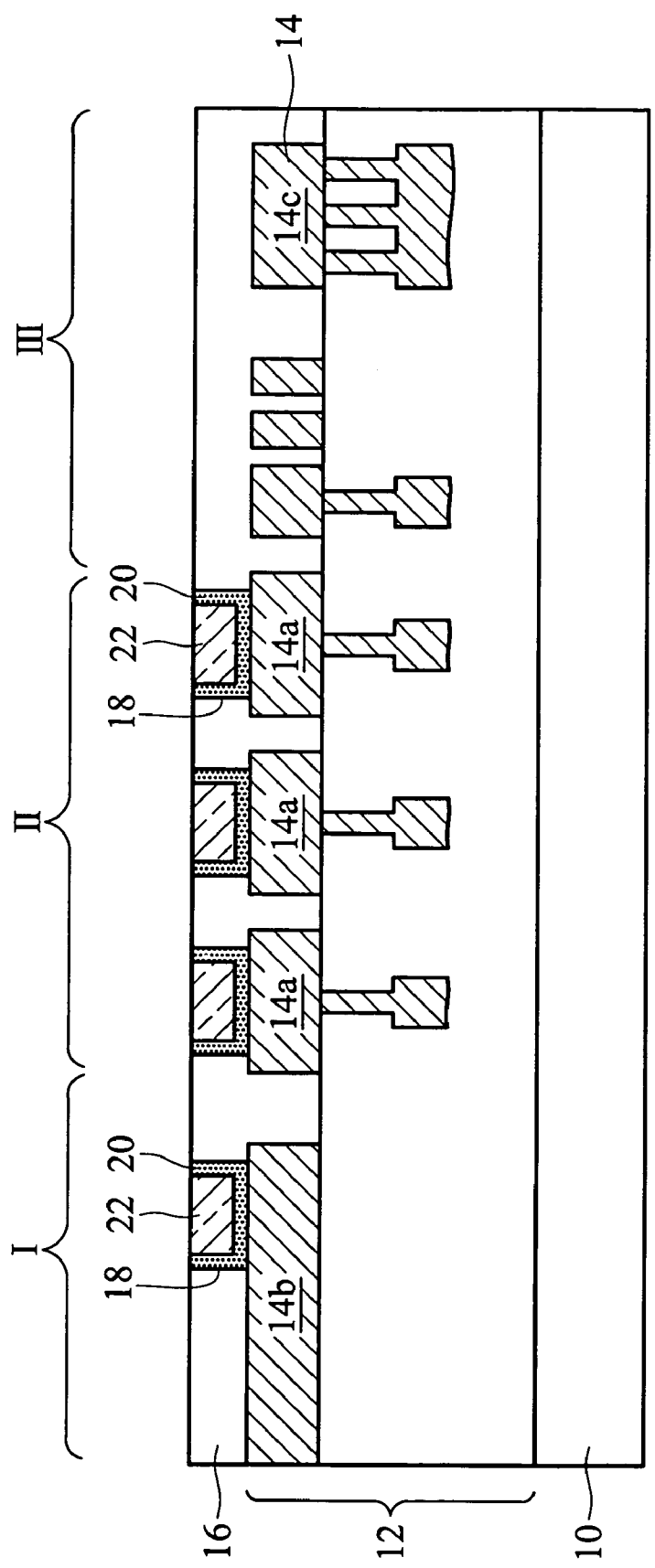

As shown in FIG. 1D, the organic spin-on material 22 and the N-type doped amorphous silicon layer 20 are then etched back until the upper surface of the dielectric layer 16 is exposed. The organic spin-on material 22 is etched back by, for example, dry etching or ion bombardment. The etchant for the dry etching can be $Cl_2$ and $O_2$. The condition of the ion bombardment is 10~50 mtorr for pressure and 25~250 mW for power. The openings 18 are, therefore, fully filled with the conformal N-type doped amorphous silicon layer 20 and the organic spin-on material 22, and the dielectric layer 16, the conformal N-type doped amorphous silicon layer 20 and the organic spin-on material 22 are substantially with a flat plane. The N-type doped amorphous silicon layer 20 is defined pixel-by-pixel in the pixel array region II for each PIN element.

Figure 1E:
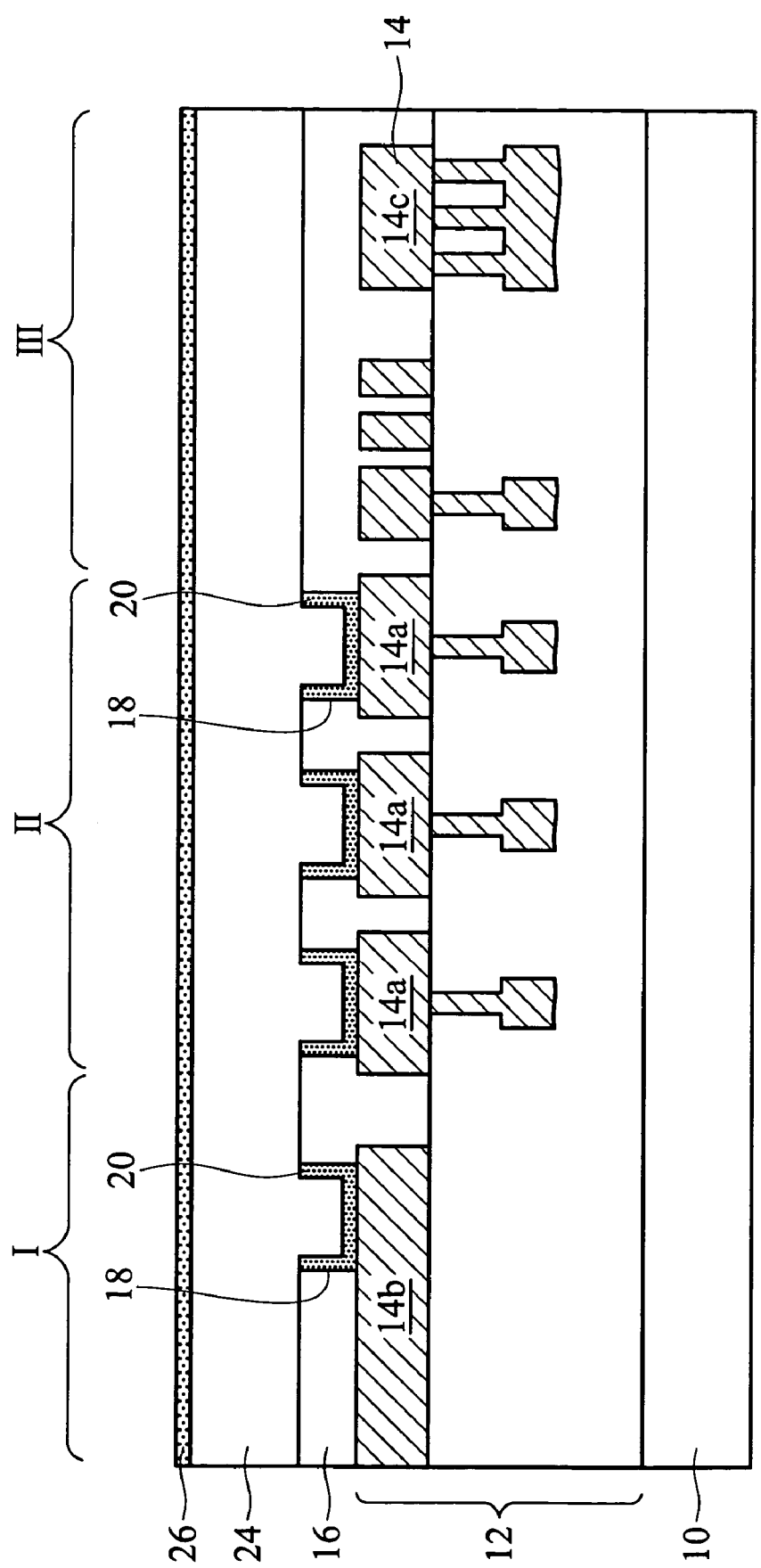

As shown in FIG. 1E, after removing the organic spin-on material 22 by, for example, wet etching, the upper surface of the conformal N-type doped amorphous silicon layer 20 is exposed. An I-type amorphous silicon layer 24 is deposited on the conformal N-type doped amorphous silicon layer 20 and the dielectric layer 16 with a thickness of about 5,000–15,000 Å. A P-type doped amorphous silicon layer 26 is deposited on the I-type amorphous silicon layer 24 with a thickness of about 100–1,000 Å.

Figure 1F:
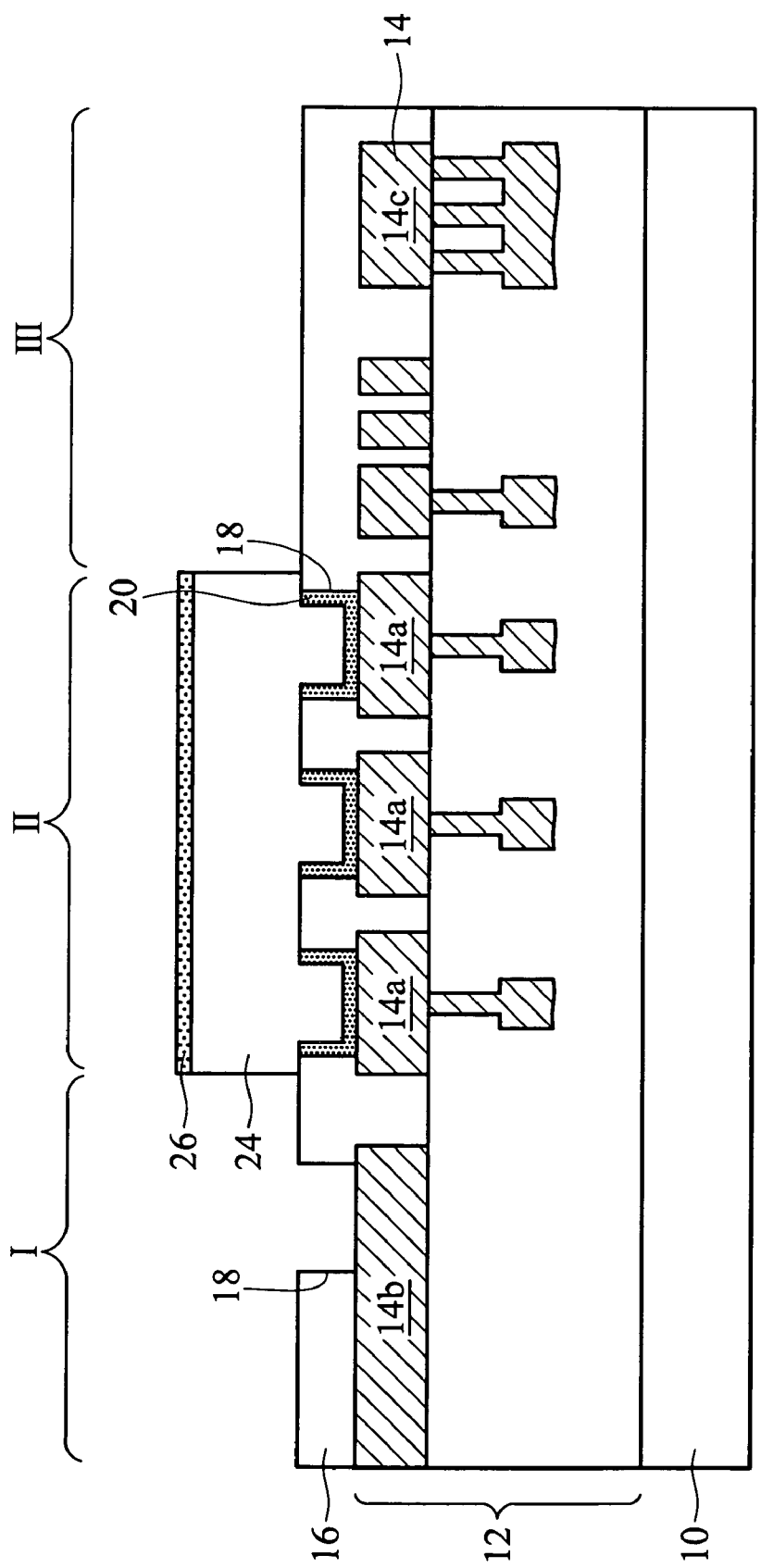

As shown in FIG. 1F, the I-type amorphous silicon layer 24 and the P-type doped amorphous silicon layer 26 are then patterned to define the pixel array region II. After defining the I-type amorphous silicon layer 24 and the P-type doped amorphous silicon layer 26, the conformal N-type doped amorphous silicon layer 20 outside the pixel array region II is removed. Therefore, the contact surface of the top metal layer 14, that is, the ground pad 14b, is exposed in the opening 18 in the ground pad region I.

Figure 1G:
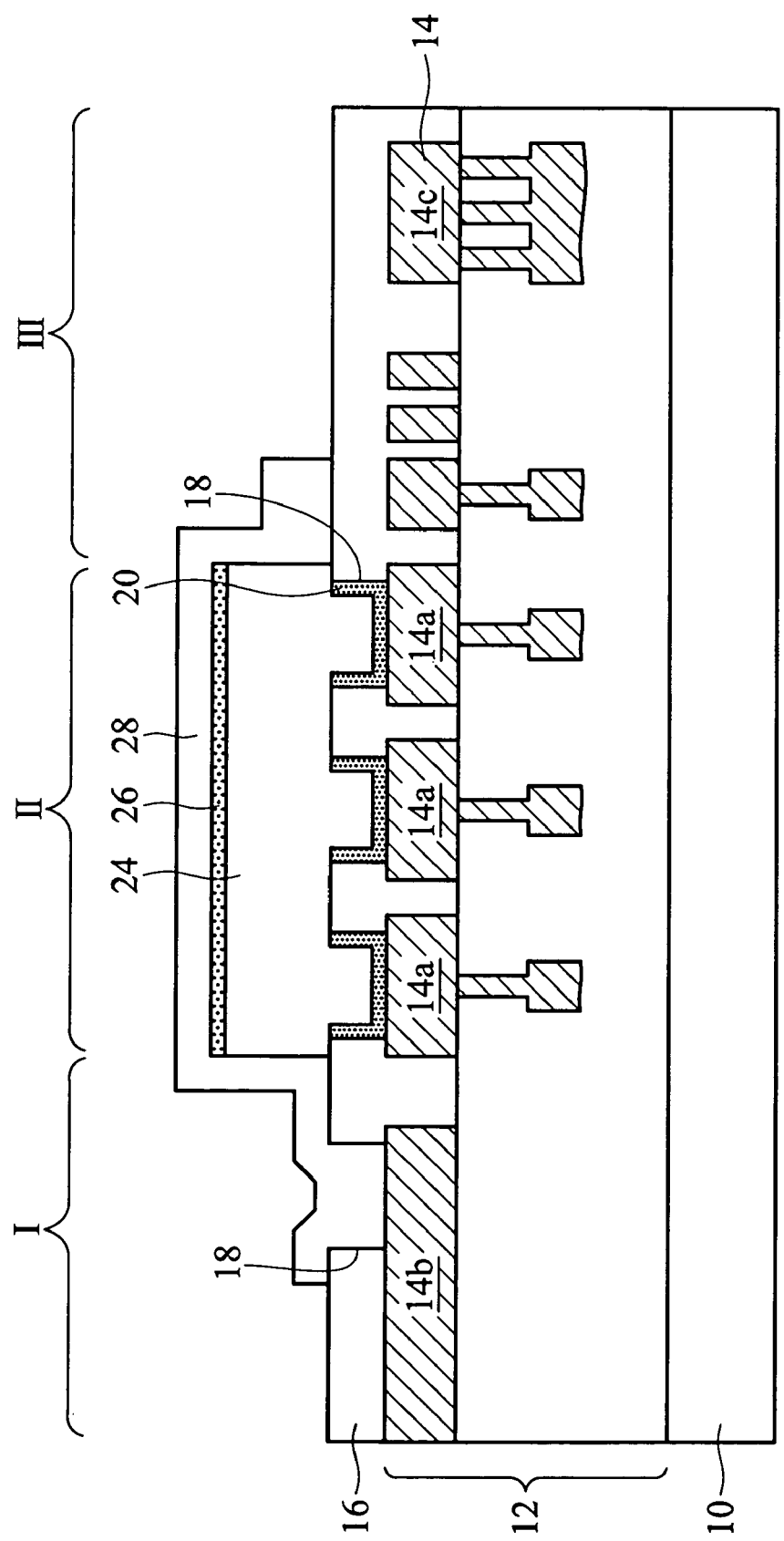

Referring to FIG. 1G, a transparent conductive layer transmitting light, such as ITO layer 28, is deposited on the P-type doped amorphous silicon layer 26 and the dielectric layer 16, and filling the opening 18 in the ground pad region I. The thickness of the ITO layer 28 is about 500–4,000 Å. The ITO layer 28 is then patterned to be an electrode contacting the ground pad 14b through the opening 18 in the ground pad region I.

Figure 1H:
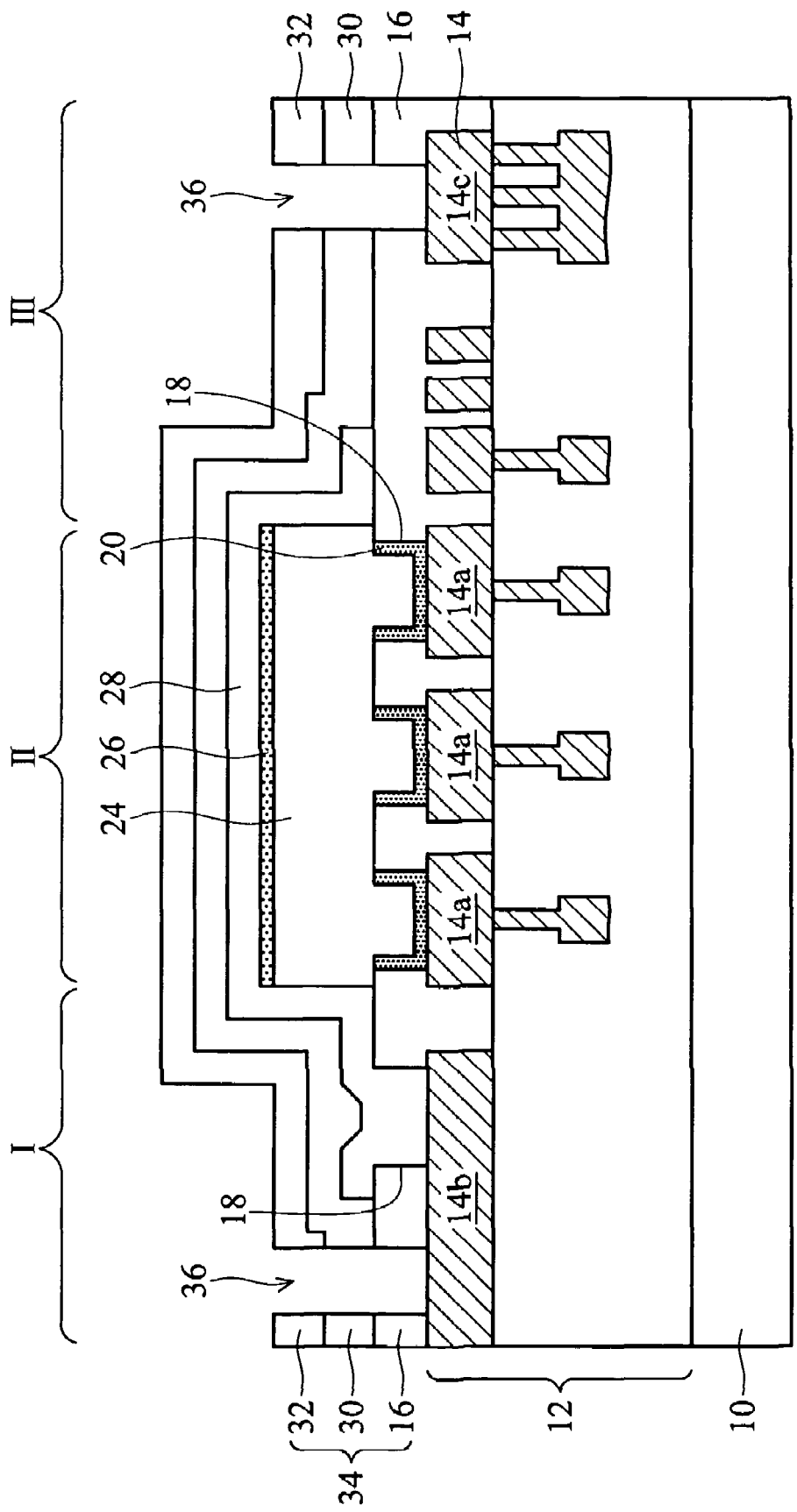

As shown in FIG. 1H, a passivation layer 34, such as a stacked layer of oxide layer 30 and nitride layer 32, covers the ITO layer 28 and the dielectric layer 16. The bonding openings 36 are formed in the passivation layer 34 and the dielectric layer 16 to expose the surface of the top metal layer 14 in the ground pad region I and the ASIC circuit region III, that is, ground pad 14b and ASIC pads 14c.

The thin-film photodiode in this embodiment uses the stacked-layer of the N-type doped amorphous silicon layer 20, the I-type amorphous silicon layer 24 and the P-type doped amorphous silicon layer 26 as an example. The reverse structure is also practicable, in which layers 20, 24 and 26 are P-type doped amorphous silicon layer, the I-type amorphous silicon layer and the N-type doped amorphous silicon layer respectively.

As mentioned above, the thin-film photodiodes are formed by a self-aligned process so as to contact the surface of the pixel electrodes. The contacting area between each thin-film photodiode and the corresponding pixel electrode 14a is not outside the upper surface of the corresponding pixel electrode. Therefore the resistance between the thin-film photodiodes and the pixel electrodes is lower so as to obtain better current collection without additional layers or processes.

The transparent conductive electrode can transmit light and directly connects to the ground pad through the opening formed with a self-aligned process for thin-film photodiodes without additional masks.

Each pixel electrode underlying the thin-film photodiode is not exposed to the I-type amorphous silicon layer because the bottom doped amorphous silicon layer of the PIN element is formed by the self-aligned and damascene methods, that is, the thin-film photodiodes are formed after covering the dielectric layer on the top metal layer and forming the openings in the dielectric layer. Therefore, the vertical leakage current is reduced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An image sensor with a vertically integrated thin-film photodiode, comprising:
   a substrate;
   an interconnection structure adjacent to the substrate, wherein the interconnection structure includes a top metal layer comprising a plurality of first metal pads for thin-film photodiodes and a second metal pad for a ground pad;
   a dielectric layer with a plurality of first openings and a second opening disposed on the interconnection structure;
   a plurality of bottom doped layers with a first conductive type respectively disposed in the first openings, wherein each bottom doped layer contacts the corresponding first metal pad without extending outside the surface of the corresponding first metal pad;
   an I-type layer disposed over at least one bottom doped layer and the dielectric layer;
   an upper doped layer with a second conductive type disposed over the I-type layer; and
   a transparent electrode disposed over the upper doped layer and contacting the second metal pad through the second opening in the dielectric layer.

2. The image sensor with a vertically integrated thin-film photodiode of claim 1, wherein the thin-film photodiodes are PIN photodiodes.

3. The image sensor with a vertically integrated thin-film photodiode of claim 1, further comprising a passivation layer covering the transparent electrode and the dielectric layer.

4. The image sensor with a vertically integrated thin-film photodiode of claim 3, further comprising a bonding opening passing through the passivation layer and the dielectric layer to the second metal pad.

5. The image sensor with a vertically integrated thin-film photodiode of claim 1, wherein the size of each first opening is about 0.5 $\mu$m×0.5 $\mu$m~20 $\mu$m×20 $\mu$m.

6. The image sensor with a vertically integrated thin-film photodiode of claim 1, wherein each bottom doped layer is conformally disposed in the corresponding first opening.

7. An image sensor with a vertically integrated thin-film photodiode, comprising:
   a substrate having a ground pad region, a pixel array region and a ASIC circuit region;
   an interconnection structure adjacent to the substrate, wherein the interconnection structure includes a top metal layer comprising a plurality of pixel electrodes in the pixel array region, a ground pad in the ground pad region and a circuit pad in the ASIC circuit region;
   a dielectric layer with a plurality of first openings and a second opening disposed on the interconnection structure, wherein a bottom of each first opening is a surface of the corresponding pixel electrode;
   a plurality of bottom doped layers with a first conductive type respectively disposed in the first openings, wherein each bottom doped layer contacts the corresponding pixel electrode;
   an I-type layer disposed over at least one bottom doped layer and the dielectric layer;
   an upper doped layer with a second conductive type disposed over the I-type layer; and
   a light transmitting electrode disposed over the upper doped layer and contacting the second metal pad through the second opening in the dielectric layer.

8. The image sensor with a vertically integrated thin-film photodiode of claim 7, wherein the thin-film photodiodes are PIN photodiodes.

9. The image sensor with a vertically integrated thin-film photodiode of claim 7, further comprising a passivation layer covering the light transmitting electrode and the dielectric layer.

10. The image sensor with a vertically integrated thin-film photodiode of claim 9, further comprising a first bonding opening passing through the passivation layer and the dielectric layer to the ground pad, and a second bonding opening passing through the passivation layer and the dielectric layer to the circuit pad.

11. The image sensor with a vertically integrated thin-film photodiode of claim 7, wherein the size of each first opening is about 0.5 $\mu$m×0.5 $\mu$m~20 $\mu$m×20 $\mu$m.

12. The image sensor with a vertically integrated thin-film photodiode of claim 7, wherein each bottom doped layer is conformally disposed in the corresponding first opening.

* * * * *